United States Patent [19]
Walker

[11] Patent Number: 5,930,303
[45] Date of Patent: Jul. 27, 1999

[54] DIGITAL MODULATION EMPLOYING SINGLE SIDEBAND WITH SUPPRESSED CARRIER

[76] Inventor: Harold Walker, 78 Oliver Ave., Edison, N.J. 08820

[21] Appl. No.: 08/963,237

[22] Filed: Nov. 3, 1997

Related U.S. Application Data

[60] Provisional application No. 60/030,164, Nov. 4, 1996.

[51] Int. Cl.[6] .............................. H03C 1/52; H04L 27/04; H03M 5/08

[52] U.S. Cl. ........................... 375/301; 375/277; 341/72; 341/53; 360/44

[58] Field of Search .................................. 375/282, 333, 375/240, 301, 277, 270, 321, 303, 308, 238; 341/53, 70, 72, 52, 55; 332/100, 103; 360/41, 42, 43, 44

[56] References Cited

U.S. PATENT DOCUMENTS

| | | | |
|---|---|---|---|
| 4,406,009 | 9/1983 | Lender | 375/291 |
| 4,497,060 | 1/1985 | Yang | 375/238 |
| 4,507,794 | 3/1985 | Jones et al. | 375/282 |
| 4,742,532 | 5/1988 | Walker | 375/277 |
| 5,185,765 | 2/1993 | Walker | 375/238 |
| 5,475,705 | 12/1995 | Dent | 375/333 |
| 5,781,076 | 7/1998 | Iwamatsu et al. | 375/261 |

OTHER PUBLICATIONS

"VPSK and VMSK Modulation Transmit Digital Audio and Video at 15Bits/Sec/Hz"; by H.R. Walker.

"Universal Formula Analyzes all Modulation Methods"; by H.R. Walker, *Applied Microwave & Wireless*, Jul./Aug. 1997, pp. 82, 84–91.

"Improved Data Transmissions Using Single–Sideband FM with Suppressed Carrier", by Bohdan Stryzak and H.R. Walker *Microwaves & RF*, Nov. 1994, pp. 23–29.

*Primary Examiner*—Stephen Chin
*Assistant Examiner*—Betsy L. Deppe
*Attorney, Agent, or Firm*—Arthur L. Plevy

[57] ABSTRACT

A method for transmitting "biphase" encoded digital signals including the steps of setting an aperture corresponding to a data bit; dividing said aperture into a plurality of segments; setting a first segment, selected from said plurality of segments of said aperture, dependent upon whether the bit is a digital one or zero; setting a second segment, selected from said plurality of segments of said aperture, so as to fit the remaining aperture of the data bit; and, transmitting said first and second segments of said data bit; wherein a narrow spectrum results containing no low frequency components and separated from 0 Hz by an amount equal to the data rate or ½ the data rate.

31 Claims, 12 Drawing Sheets

DIGITAL MODULATION EMPLOYING SINGLE SIDEBAND WITH SUPPRESSED CARRIER

RELATED APPLICATION

This application claims the benefit of provisional application No. 60/030,164, filed on Nov. 4, 1996.

FIELD OF THE INVENTION

This invention relates to an improved single sideband radio transmission method for the transmission of digital data utilizing a single sideband technique that does not generate or employ a carrier frequency.

BACKGROUND OF THE INVENTION

The single sideband is generated independently by digital synthesis and transmitted over wire lines or radio frequency channels for detection by a detector circuit that does not require the re-insertion of the carrier. The method has a very narrow bandwidth as transmitted, being much narrower, or higher in terms of bandwidth efficiency in bits/second/Hz, than currently employed methods. The invention has broad utility in radio, microwave, and satellite applications.

Various digital modulation schemes are known to those skilled in the art. These methods have varying bandwidth efficiencies that have been calculated in various texts and analyzed for other characteristics as well. One such summary is given in a paper by this inventor published in *Applied Microwave and Wireless Magazine,* July/August 1997. In general, most of the existing methods modulate a carrier which is suppressed in the modulator, then recovered and re-inserted in the receiver. Single sideband digital modulation is possible but has been rarely utilized to date. One such method is the Variable Phase Shift Keying (VPSK) method covered in U.S. Pat. Nos. 4,742,532 and 5,185,765 issued to the present inventor. This method utilizes a special data encoding method and single sideband transmission to achieve bandwidth efficiencies of as high as 15.3 Bits/sec./Hz. A carrier is required to recreate the single sideband suppressed carrier signal and to decode the signal in the receiver.

It has been found that proper encoding of the signal at baseband can result in a very narrow frequency band being occupied at baseband and that this can in turn be transmitted SSB-SC in a very narrow RF bandwidth. Bandwidth efficiencies as high as 50 bits/second/Hz have been demonstrated in the laboratory, with 26–27 b/s/Hz being achieved in usable hardware. A comparison of this new method, which has been named Very Minimum Shift Keying (VMSK), with the older VPSK method, appeared in the January 1997 issue of the IEEE Transactions on Broadcasting.

It has been found that the previously used methods for SSB digital modulation, which involved baseband encoding, a carrier and filtering to remove the unwanted sideband, are unnecessarily complex. The characteristics of the sideband alone are reproducible by direct digital synthesis. Although the signal can be detected by normal means, that is by re-constructing a carrier and reinserting it in the detector to recover the encoded baseband signal, this is not necessary. There is sufficient information in the sideband alone to be detected without a carrier.

High bandwidth efficiency methods generally lose power as a result of the bandwidth compression. That is not the case with the present invention, which theoretically maintains the same signal to noise ratio, regardless of bandwidth efficiency. This seemingly violates Carson's Rule and Shannon's Limit. As will be shown, this is not the case with the present invention.

SUMMARY OF THE INVENTION

A method for transmitting "biphase" encoded baseband digital signals comprising the steps of dividing a bit into a plurality of apertures, setting a first segment, selected from said plurality of segments of said aperture, dependent upon whether the bit is a digital one or zero; setting a second segment, selected from said plurality of segments of said bit, so as to fit the remaining aperture spaces of the data bit; and, transmitting said first and second segments of said data bit by phase reversal; whereby a narrow spectrum results containing no low frequency components which is separated from 0 Hz by an amount proportional to the data rate.

DETAILED DESCRIPTION OF THE INVENTION

The present invention encodes the data into a "Biphase" format which has a spectrum located at the bit rate above and below the carrier, or zero Hz at baseband. The encoding method, which has been named "Aperture Coding", is shown in FIG. 1.

This coding method, used at baseband, has a code width of one bit. The first half of the bit is made to last a specific period, in this case 6/13 of the total bit width where the bit is divided into 13 apertures. The decoding circuit, on detecting this time duration will automatically designate this bit as a digital one. If the bit is stretched to cover 7/13 of the bit width, it will be decoded as a zero. The zero crossing fits into the left half bit aperture if it is a one and the right half bit aperture if it is a zero. It is not necessary to use 13. Any symmetrical pair will do, for example 11,12(23). Smaller apertures can be used for decoding. For example, the bit can be divided into 13 small apertures with the zero crossing having to fit specifically into a 6/13 or 7/13 aperture period instead of the larger first half/second half apertures.

It is obvious to those skilled in the art that this waveform is actually the data clock waveform with a phase distortion at the center. It is also obvious to those skilled in the art that this waveform can be defined by a Fourier series having a base frequency equal the bit rate plus odd harmonics plus a varying low frequency amplitude $A_o$, component depending on the data pattern.

Figure 1:
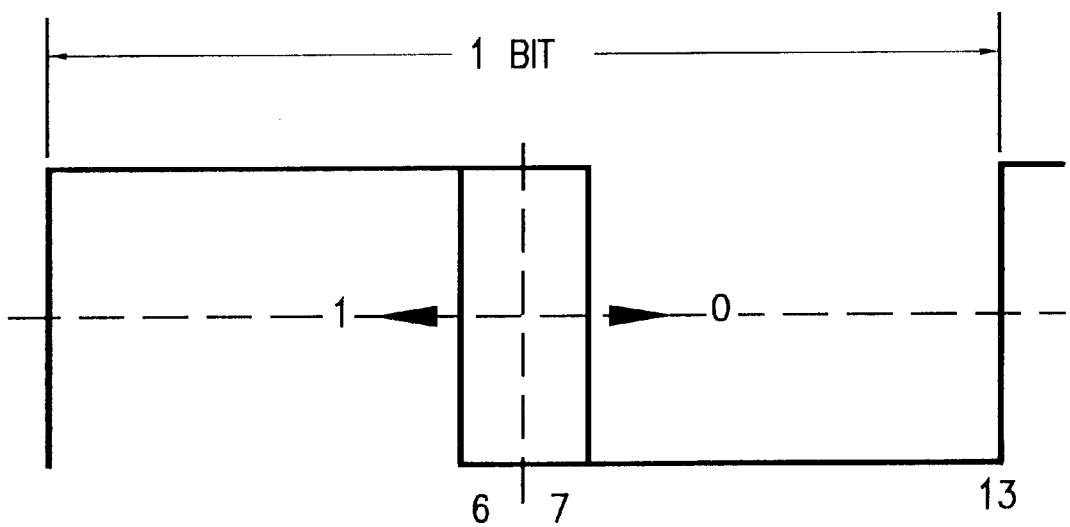
FIG. 1. The Aperture Code.
Figure 10:
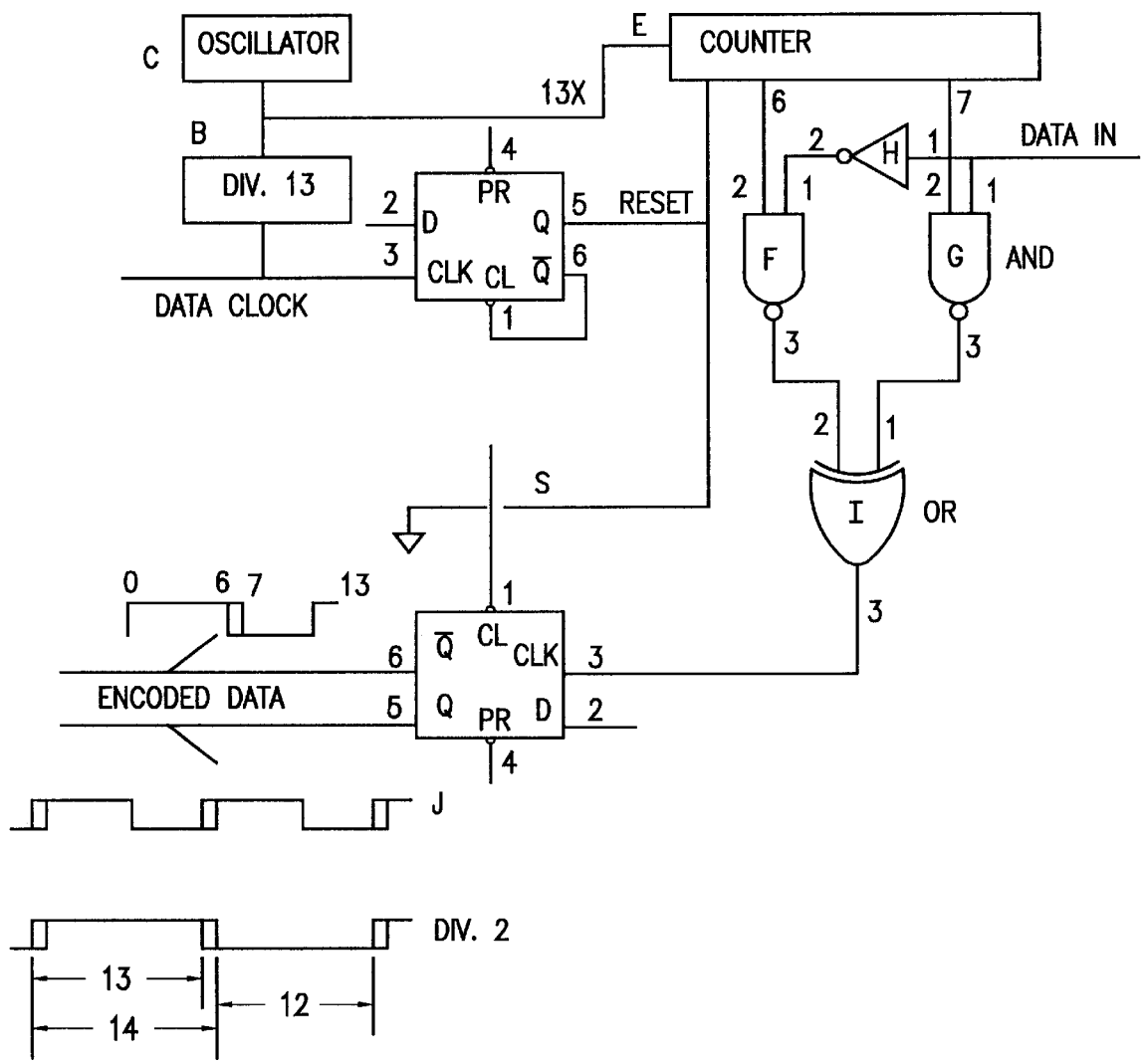
FIG. 10. Shows a device for dividing the aperture code by two to yield a three time difference code which can be converted into three frequencies using a device such as the one illustrated in FIG. 16.

A method for generating the aperture codes shown in FIG. 1 at baseband is shown in FIG. 10. An oscillator (c) operating at 13 times the bit rate is used to supply two divide by 13 counters (B) and (E). Counter (B) provides a clocking signal for the incoming data and a drive signal to a flip flop with automatic reset. This automatic reset is delayed by the delay time to pass through the flip flop and results in a very narrow spike (one shot) after each positive incoming clock voltage swing. This spike resets the counter (E) and clears the JK flip flop (J). The counter E has two outputs, one for a 6 count and one for a 7 count. Data is input at (L) to be added to the 6 or 7 signal. If the data is a one, the JK flip flop is set via gates (G) and (I) after a 6 count. If it is a zero, it is set after a 7 count via gates (F) and (I).

Information encoded in this manner can be used to modulate an RF carrier, or it can be used as a baseband signal for transmission over wire lines. In the latter case, the clock is recovered from the rising edge of the signal and the data from the falling edge. As an RF signal it consists of a carrier with two sidebands, an upper and a lower, only one of which needs to be transmitted. The sideband has the appearance shown in FIG. 2.

When used at baseband, the signal can be limited to remove any AM components, such as noise, from the phase modulated signal. This makes it possible to superimpose a low level low frequency AM signal for control or other purposes on top of the phase modulated data signal. The data rate for the PM signal is generally much higher than that of the AM signal so that the sampling rate eliminates almost all of the phase changes that would be introduced by the AM modulation.

Figure 2A:
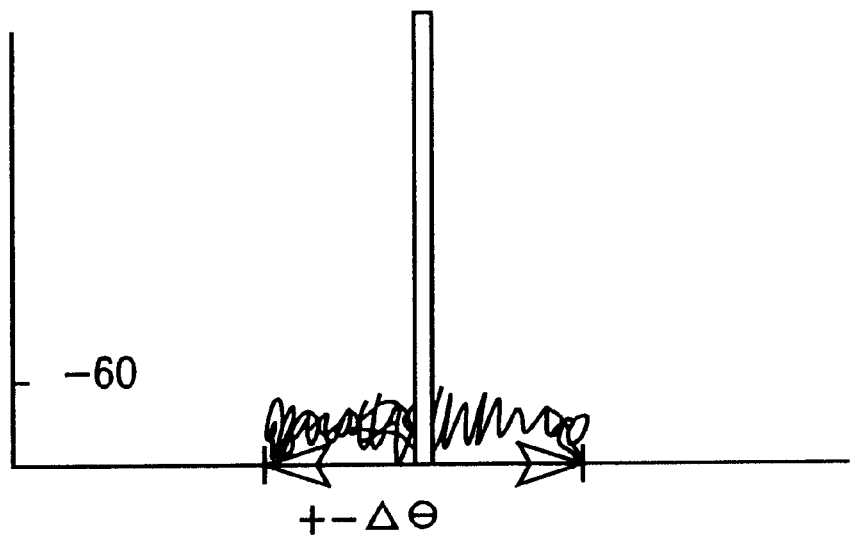
FIG. 2. The spectrum of an aperture coded signal shown at baseband or as a single sideband located above the carrier. As created is shown below. After narrow band filtering as shown above.
Figure 2B:
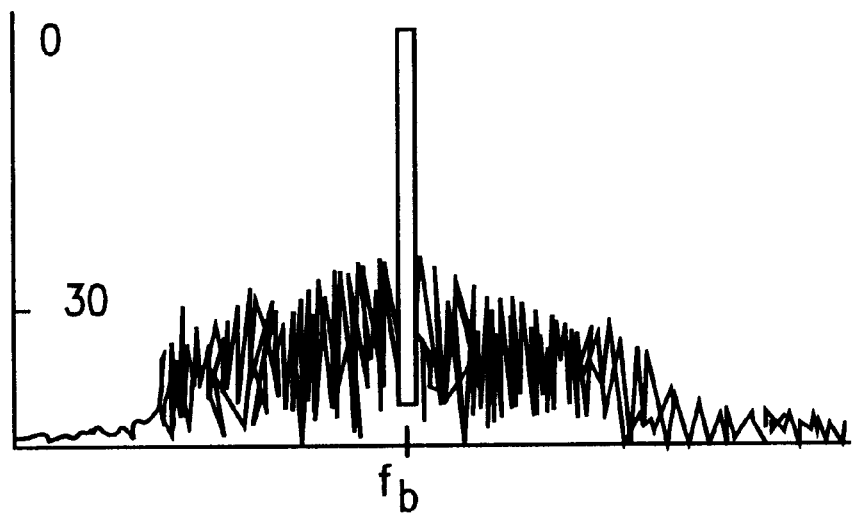

The spectrum shown in FIG. 2 consists of a central spike frequency at the data rate fb plus the Fourier amplitude products shown as a form of frequency or phase noise at a relatively low level. If the data rate is a sub-multiple of the modulated carrier, the carrier can be restored from the single sideband frequency by detecting the single frequency spike, dividing it down, then multiplying it back up by the carrier/data rate multiple.

An alternate method to restore the carrier is to use the small aperture method described above with the method used for VPSK modulation described in "Improve Data Transmission Using Single Sideband with FM Suppressed Carrier", by B. Stryzak and H. R. Walker which appeared in the November 1994 issue of *Microwaves and RF Magazine, Wireless Design Supplement*. This method involves using a ringing coil at 13 times the bit rate (assuming a 6,7(13) code is used) which is caused to ring by one shot multivibrator spikes obtained from the zero crossings. The RF frequency must be a multiple of the data rate and the ringing frequency, but not necessarily an integer multiple.

The time periods given in this example can be any pair of time periods. It is well known to those skilled in the art that time is convertible to frequency (f=1/t). Thus instead of having two time periods, two frequencies of equal time duration can be used at RF. When mixed with a coherent carrier, the basic Fourier frequency of the aperture encoded waveform appears as the difference frequency, with decodable zero crossings. This can then be decoded to ones and zeros by squaring the waveform and then determining the aperture time.

The two frequencies used are similar in effect to the two frequencies used for Gaussian Minimum Shift Keying (GMSK) in that they result in a phase or frequency modulated signal. In the case of GMSK, the frequencies are ±¼ the data rate. The resulting spectrum results in a central frequency spike as shown in FIG. 2, plus two sidebands at 0.24 times the peak level. The modulation index in FM/PM terms is 0.5 GMSK can be created by filtering the data input, the modulator output, or by means of a digital synthesizer. This is a double sideband method well known in the art which does not have a suppressed carrier.

The alternate methods of generating it are FM, PM or FSK (frequency shift keying). The modulation index of 0.5 is essential to its operation.

In the present method, the frequency shift or deviation used is much lower than that used for GMSK. In lieu of a modulation index of 0.5 a modulation index between approximately 0.04 and approximately 0.01 is being used in practice.

It has been noted that when GMSK is derived using FM, the sidebands are Bessel products, while using FSK generates Fourier products. This may not be obvious to the observer without careful study. Utilizing a digital synthesizer and a modulation index of 0.5 the sidebands appear as expected from modulation theory at the carrier plus or minus the modulation frequency fm. It has been noted however that when the modulation index is further reduced, the Bessel products disappear and the remaining signal consists of the central frequency which is now (fc+fm), with Fourier products at a level about −40 dB below this central frequency. Thus only 1 ten thousandth of the energy lies in the Fourier products. This synthesized signal can be further filtered to remove these amplitude products leaving only the central spike shown in FIG. 2. (a) plus or minus a small deviation frequency.

The meaning and importance of this is not intuitively obvious. What has happened is that the signal is no longer a carrier with two sidebands, but becomes a single sideband alone. It has been generated without a carrier ever having been present. This single sideband signal can be transmitted and detected by the normal means described above using a phantom carrier. The fact that the signal appears to be a single frequency line would appear to violate Carson's Rule. This is not the case however, since inserting the phantom carrier restores the signal to the full bandwidth required by Carson's Rule, that is fc±fm. The full modulation, or Nyquist bandwidth is present, but it has not been transmitted.

It is to be noted also that since only a very narrow bandwidth has been transmitted, the noise bandwidth at the receiver is much less than that called for by Carson's Rule and the Nyquist bandwidth. This is of great importance in mathematical analysis of the signal. These relationships can be seen in FIG. 3.

Figure 3:
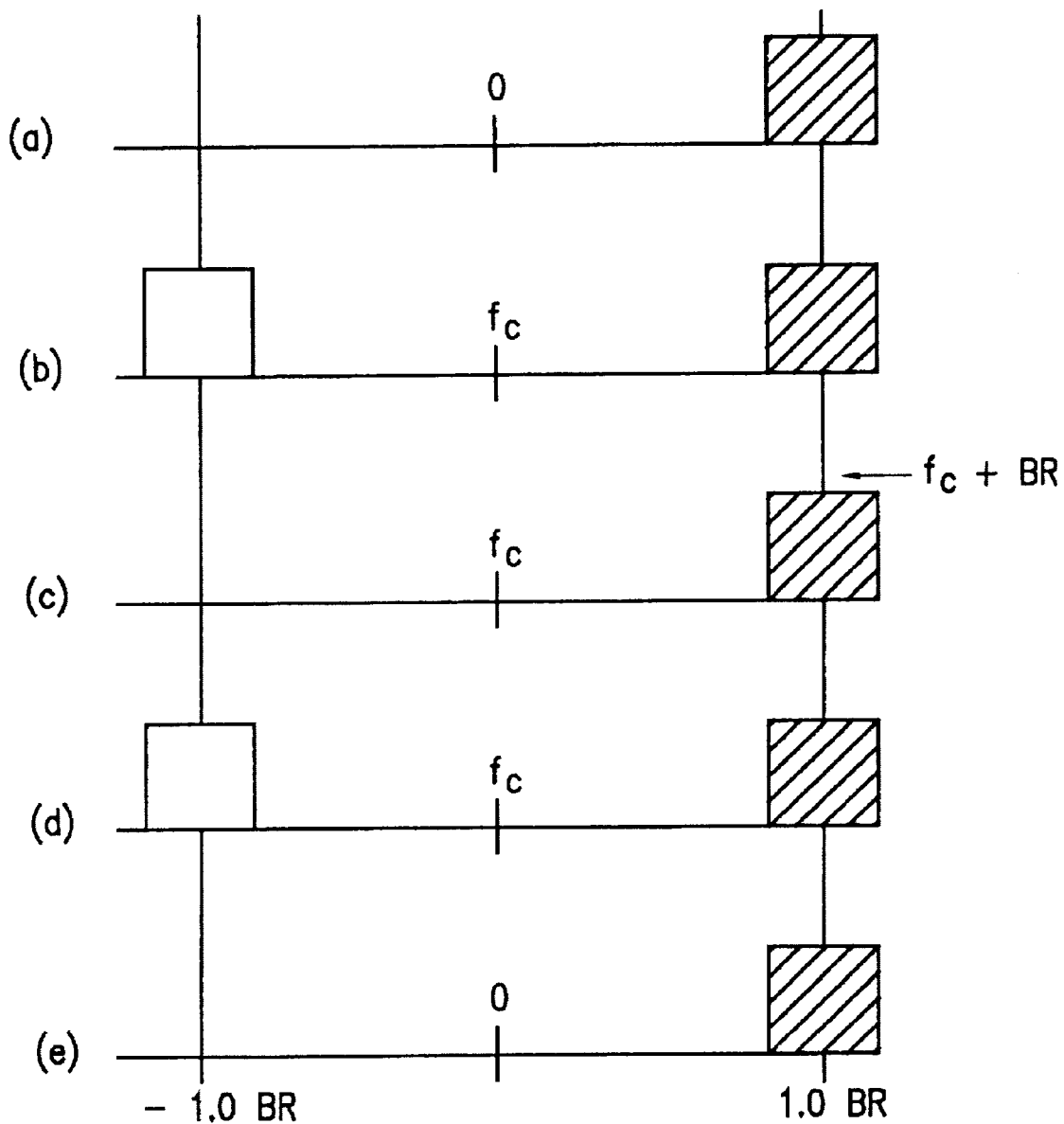
FIG. 3. Shows encoding and decoding method for a baseband necessary to explain the present invention.

In FIG. 3, the baseband signal as generated by the aperture code is seen in (a). This signal can be used to modulate a carrier resulting in the spectrum seen in (b). The signal is then transmitted single sideband with suppressed carrier as shown in (c). At the detector, a coherent carrier is reinserted resulting in the restoration of the baseband signal as shown in (d) and (e).

It has been found that these methods are unnecessarily complex. Using a direct digital synthesizer as described above, with two frequencies replacing the two time periods of the aperture coding, the signal as generated is that shown in (c). No carrier was ever used or needed. Detection can employ a reinserted phantom carrier with the results shown in (d) and (e).

Figure 4:
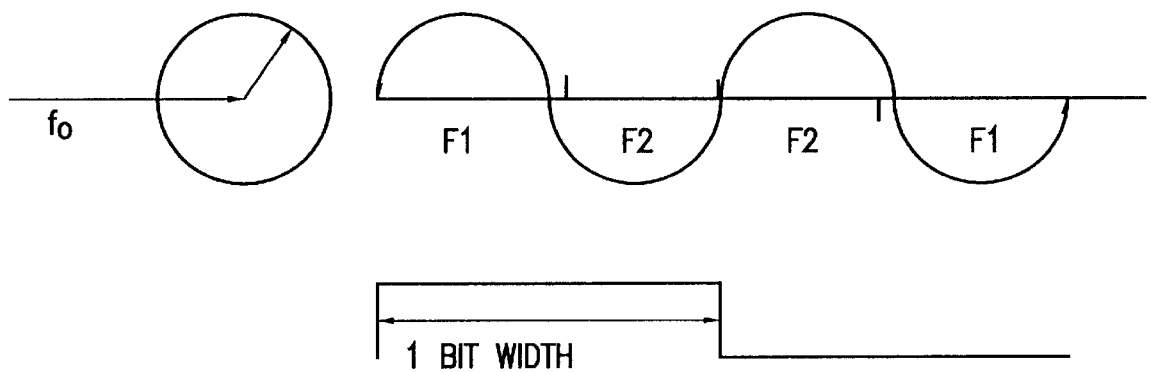
FIG. 4. Shows a single sideband signal, along with a reinserted carrier fc, as generated by a direct digital synthesizer or numerically controlled oscillator.

The single sideband signal as generated by the direct digital synthesizer or numerically controlled oscillator is shown in FIG. 4, along with a reinserted carrier fc. The resulting beat or difference frequency has negative going zero crossings to the right or left of the bit center as shown. By utilizing frequencies instead of time, the pattern of FIG. 1 can be reconstructed.

Figure 5:
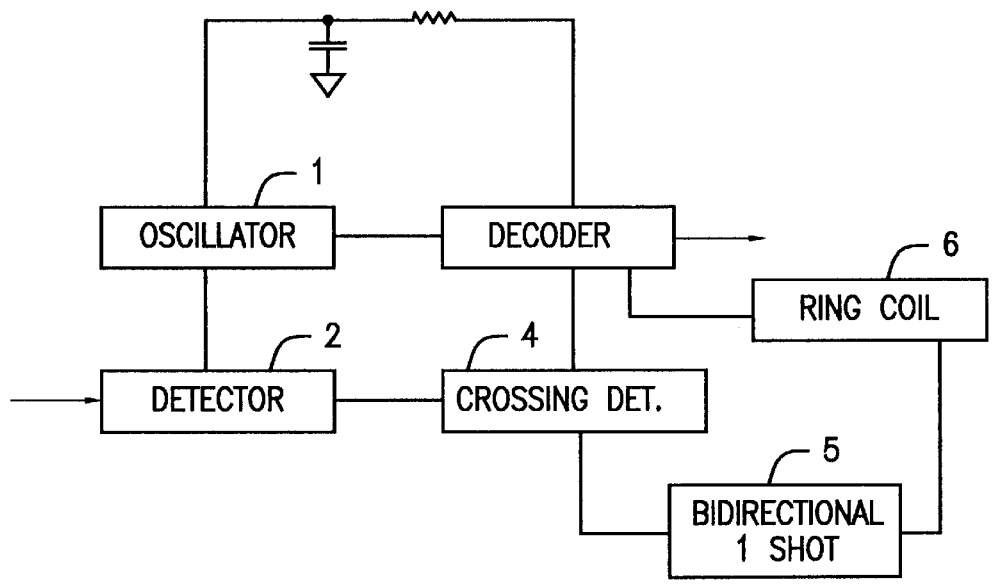
FIG. 5. Shows a detector circuit utilizing the ringing coil method of carrier recovery.
Figure 11:
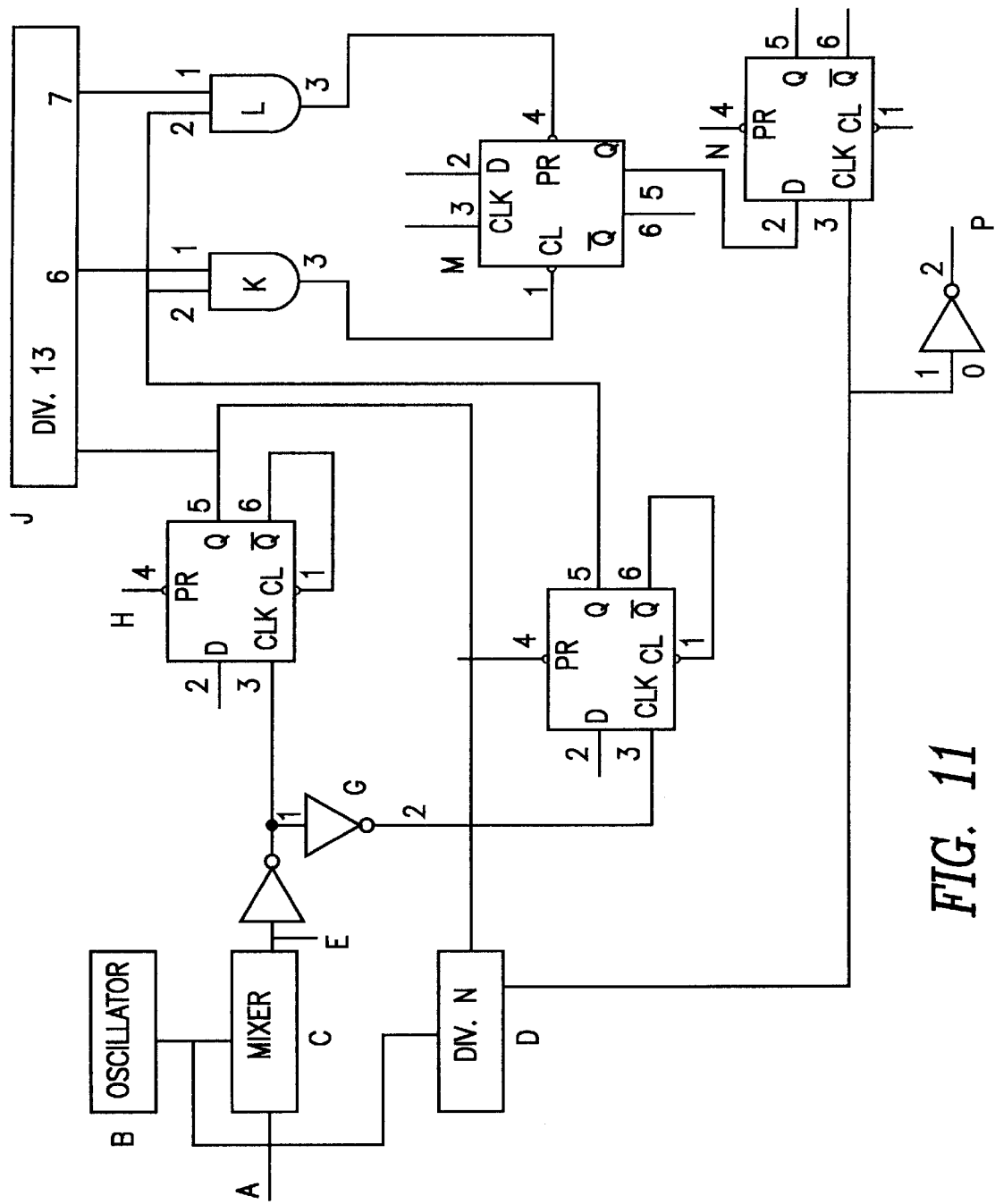
FIG. 11. Shows a suitable decoder.

FIG. 5 shows a detector circuit utilizing the ringing coil method of carrier recovery. This is the method described by Stryzak and Walker in the referenced paper. An oscillator (1) operating at the IF frequency is used with a coherent detector (2) to obtain the detected waveform given in FIG. 4. This is squared in a limiting amplifier (4), followed by a bidirectional one shot (5) and a ringing coil (6) that obtains energy from the one shot to ring at a frequency equal to the total aperture number, times the data rate (13 in the example). The decoder contains a divide by N counter, whose output is compared in a phase comparator to yield an AFC voltage that causes the oscillator to lock in frequency to the correct carrier frequency. This phase locked loop technique is well known to those schooled in the art. The decoder is able to detect early and late crossings that indicate a zero or one. A suitable decoder is shown in FIG. 11.

Figure 6:
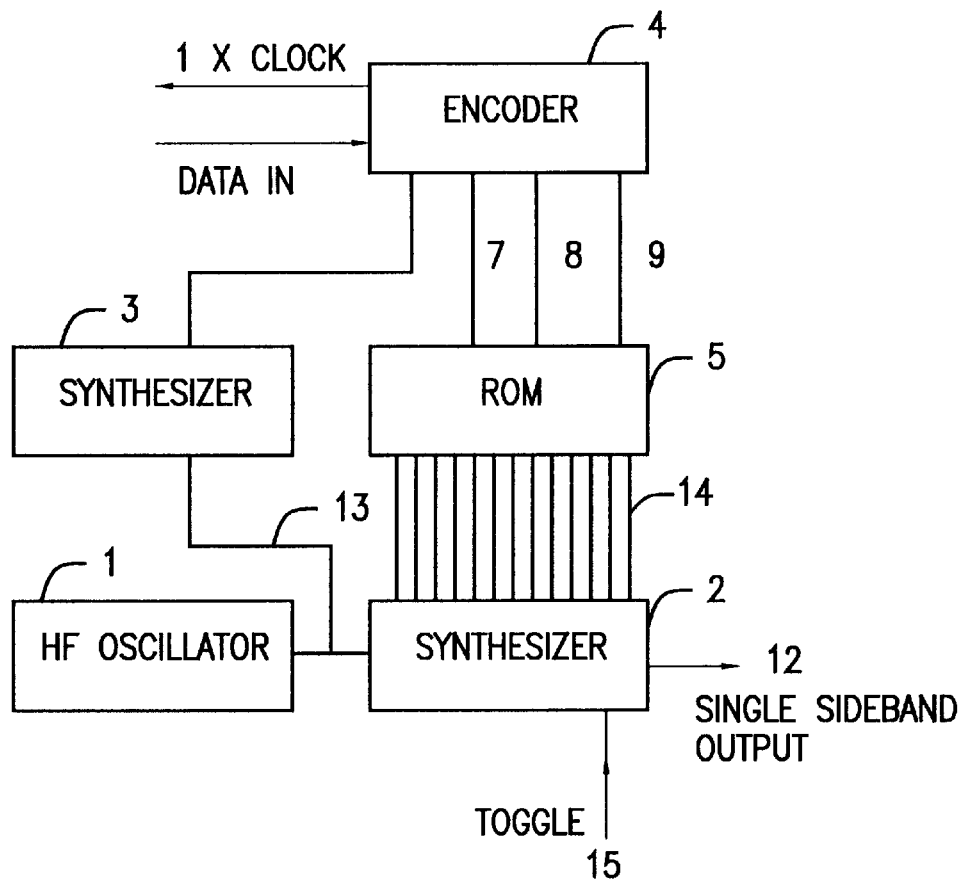
FIG. 6. Shows an RF modulator applicable to the present invention.
Figure 16:
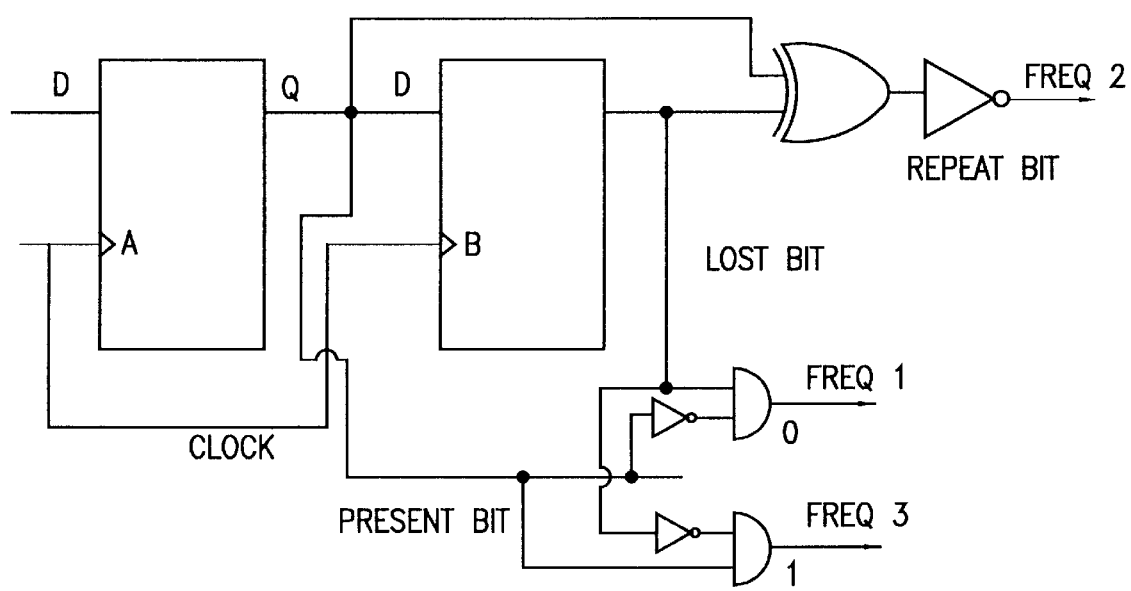
FIG. 16. Shows an encoder circuit used to program a direct digital synthesizer to utilize three frequencies as disclosed.

It has been found however that a reinserted carrier is not necessary. There is sufficient information in the central SSB frequency spike alone to detect the signal with a quadrature, frequency, or other phase detector utilizing a narrow band crystal as the phase discriminating element. Thus it is possible to go from (c) to (e) in FIG. 3 without ever using a carrier at the transmitter or receiver. Detectors of the above types are well known to those skilled in the art. FIG. 6 shows an RF modulator applicable to the present invention. A high frequency oscillator (1) generates a clocking signal that is used by the synthesizers (2) and (3). Synthesizer (3) determines the clock rate for the incoming data. The encoder (4) shown in FIG. 6 receives the incoming data and converts it to the Aperture code or a slip code as described in U.S. Pat. Nos. 4,742,532 and 5,185,765 issued to the present inventor. Lines (7), (8) and (9) address a Read Only Memory (ROM) that has outputs which program the synthesizer (2) to determine what frequency will be synthesized. The synthesized IF frequency appears at the output (12). Suitable encoders are shown in FIGS. 7 and 16.

Figure 7:
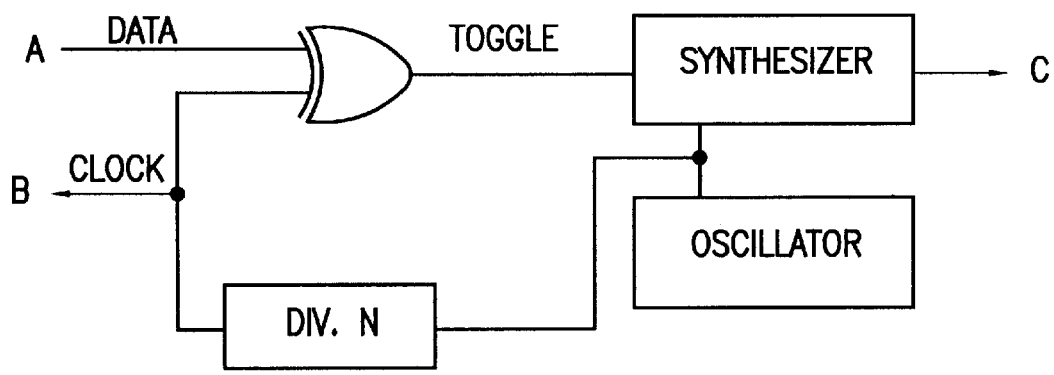
FIG. 7. Shows a simplified alternate method to cause a Direct Digital Synthesizer to generate two frequencies.

A simplified alternate method is shown in FIG. 7. Some DDS circuits can be toggled in a two frequency mode. If the synthesizer is preprogrammed by means of a controlling microprocessor or a ROM sequence, this circuit can be used. The data clock to the data source appears at (B). The data is input to the XOR gate via (A) causing it to toggle frequency 1 or frequency 2 according to whether the bit is a one or zero.

The XOR gate causes polarity reversal in the middle of the bit according to the match between the clock polarity and the data polarity. If they are alike, the output is low. If different, the output goes high. A change from f1 to f2 or vice versa occurs at the center of the bit by toggling the DDS (2) of FIG. 6.

Figure 8:
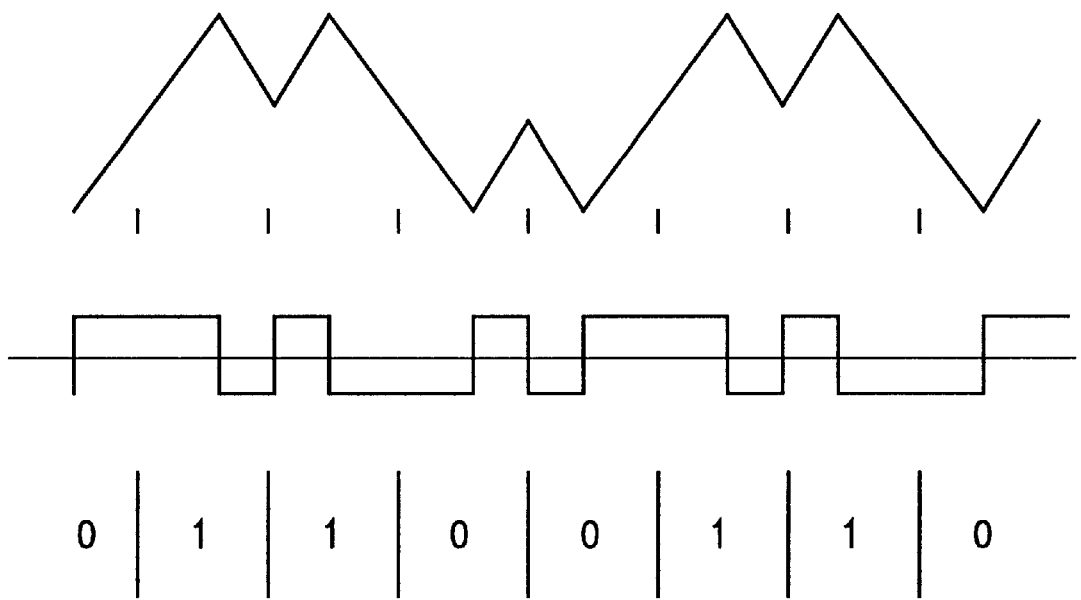
FIG. 8. Shows a signal from the quadrature or similar detector which has an "Eye Pattern".

The detected signal from the quadrature or similar detector has an "Eye Pattern" as shown in FIG. 8. This is the pattern for a repeating CC Hexadecimal sequence (1100110011 etc.). A digital one is represented by frequency 1 occurring first in the bit period with frequency 2 completing the last half. A digital zero has frequency 2 for the first half of the bit period and frequency 1 for the last half. When there is a change from 1 to 0, or 0 to 1, the rise or fall has double length (time). Repeated 1s or 0s have short periods.

To decode this eye pattern, the triangular waveshape is differentiated to obtain a rectangular waveshape that is identical to Manchester code. This can then be decoded to obtain ones and zeros. Although the detected result is in the form of a Manchester code, the spectrum employed is not that of Manchester coding at baseband. Manchester coding at baseband would extend from the bit rate $f_b$ down toward 0 Hz, while the spectrum of the present invention is $f_b$ plus or minus a small frequency variation.

Figure 12:
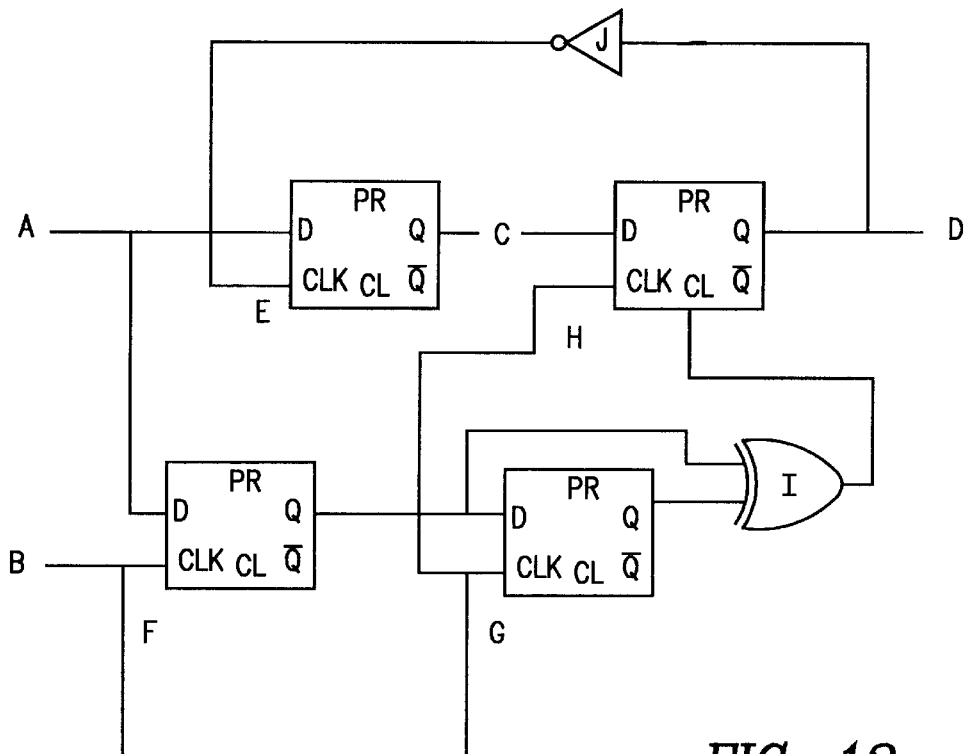
FIG. 12. Shows a simple decoder for Manchester code applicable to the present invention.

A simple decoder for Manchester code applicable to the present invention is given in FIG. 12.

Figure 13:
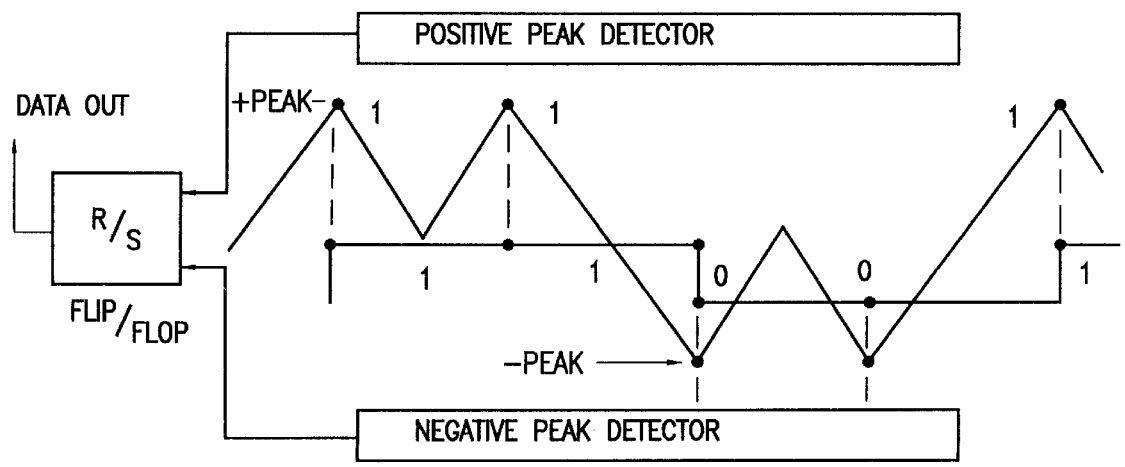
FIG. 13. Shows an alternate method of detection which comprises peak detectors and an R/S flip/flop.

An alternate method of detection is obvious from the waveform shown in FIG. 8, which comprises peak detectors and an R/S flip/flop shown in FIG. 13. Utilizing this alternative method there is no need for a differentiator and Manchester decoder.

Figure 14:
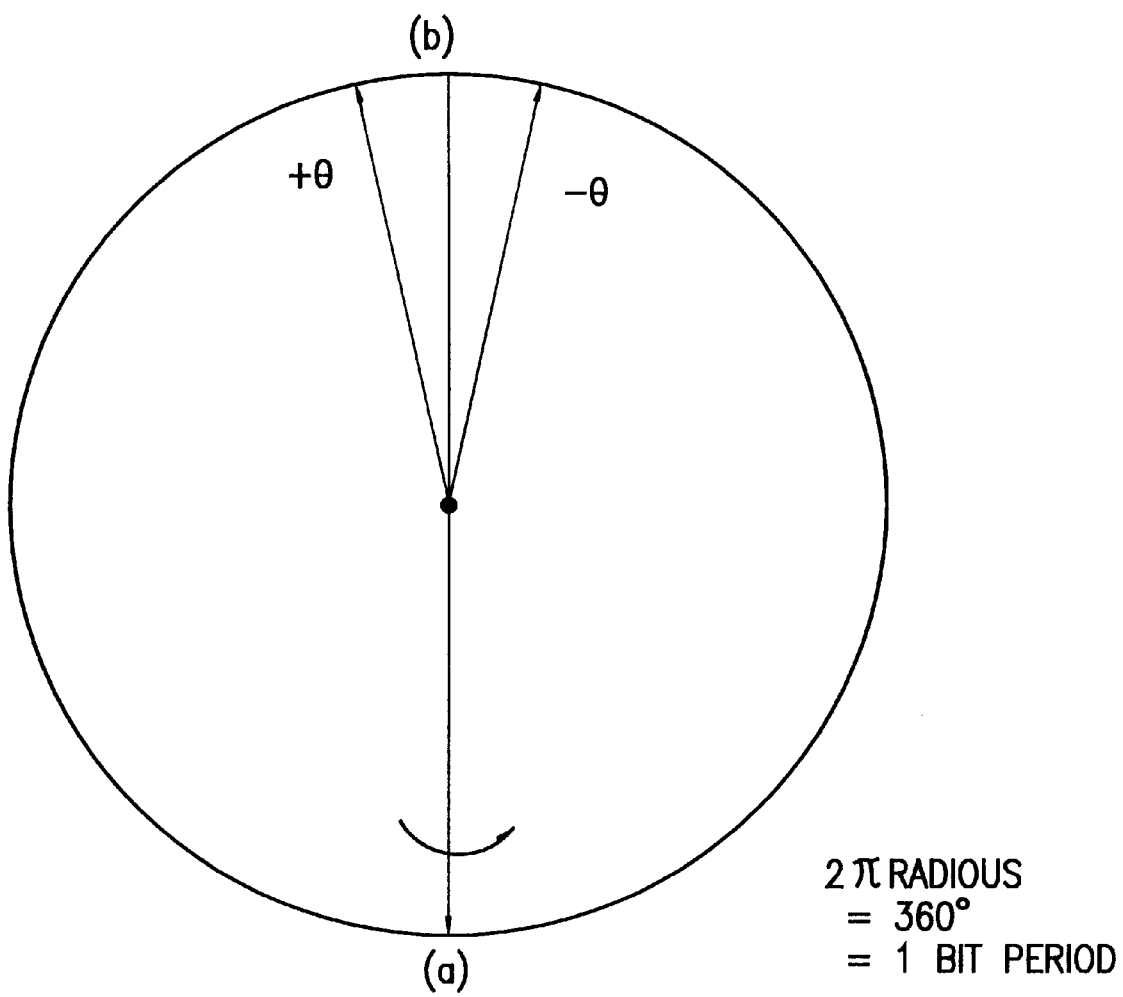
FIG. 14. Shows a phasor plot of the signal seen in FIG. 8.

The phasor plot of the signal seen in FIG. 8 is shown in FIG. 14. The full circumference is 2 pi radians. Each change utilizing the aperture coding method shown in FIG. 1 passes through (a) for the rising edge and ends at (b) plus or minus an amount equal to θ, or ½ the modulation angle 2θ, for the falling edge, or bit polarity determining edge.

From FIG. 8 it can be seen that when using frequencies or phase angles the frequencies need not change at the bit boundaries, but do change at the peaks. Instead, as in FIG. 13, the bit polarity is determined by the rise or fall of the triangular waveform and the end of the bit is marked by the positive or negative peak. The read out is delayed one bit time. It is not necessary to force a transition at the midpoint.

Figure 15:
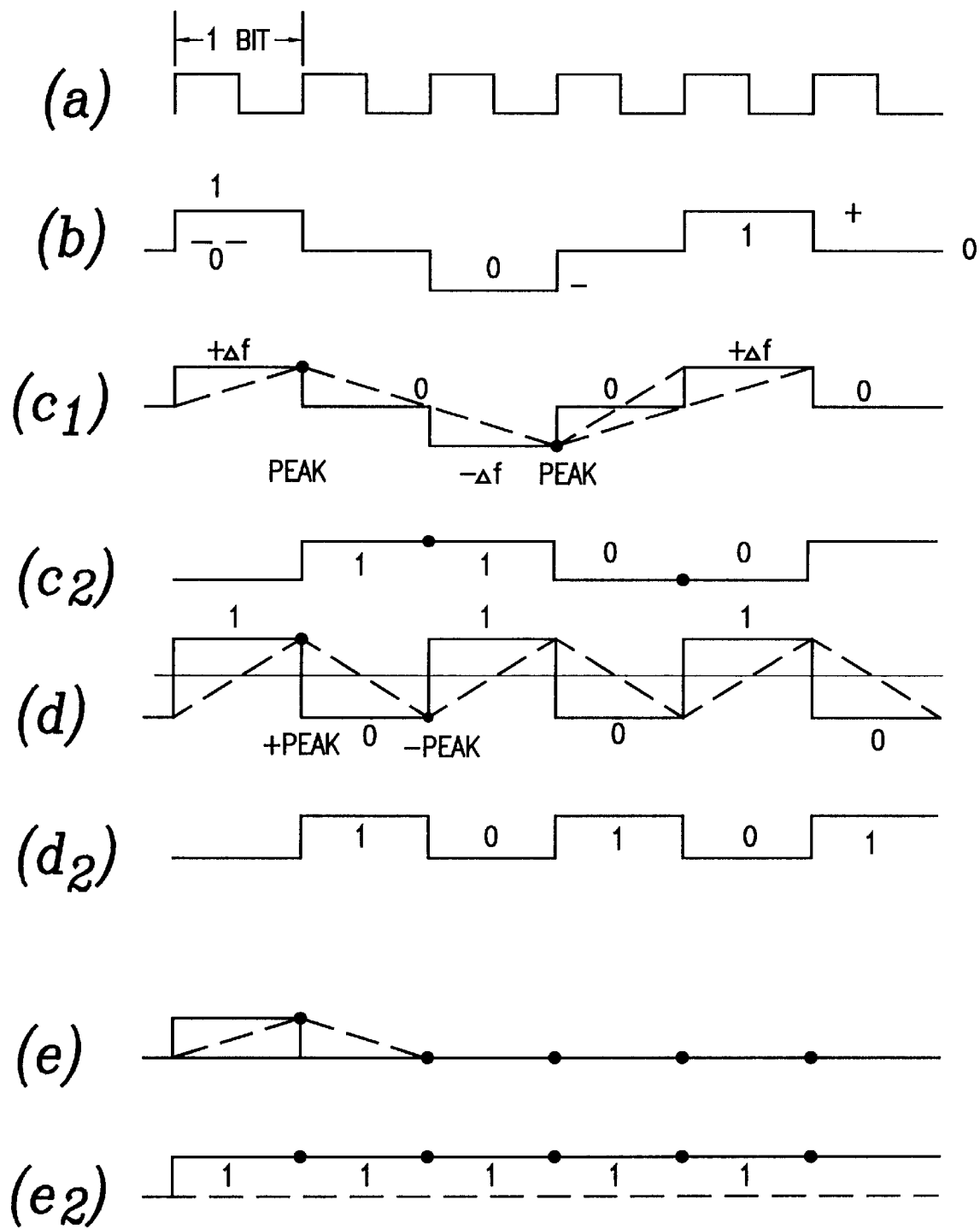
FIG. 15. Shows the number of phase changes (2θ) to go from 1 to 0 or 0 to −1.

The transmission frequency can be cut in half for a given data rate by using three phases instead of two together with the sideband synthesizer which is the basis of this invention. FIG. 10 shows how the aperture code is generated and then may optionally be divided by two to yield a three time difference code which can be converted into three frequencies using a device such as the one illustrated in FIG. 16. This change from a two frequency to a three frequency code being obtained by the setting of the switch S. The aperture code shown in FIG. 1 has three time points, T1, T2, and a third at the center of the bit which is halfway between the other two. This becomes apparent when the aperture coded signal is divided by 2. In this case, the three points 6, (6.5), and 7 become 12, 13, and 14, thus making it possible using the positive and negative swing, and peaks 12 or 14, to determine polarity (1 or 0) plus a return to the center when a bit is repeated (13), the waveform as detected is shown in FIG. 15. This is shown in FIG. 14 as the rest or center point at (b) with the excursions being plus or minus θ. The three frequency code of the present invention thus resembles the previously patented "slip code" but the encode and decode algorithms differ. This three phase or three frequency method is covered above using the VPSK slip code as an encoding example. As shown in FIG. 15 it takes two phase changes (2θ) to go from 1 to 0 or 0 to −1. If there is a repeat only one phase change need be done, a second repeat requires no phase change. A subsequent change then adds the second change of θ degrees. For a 101 or immediate or 10 or 01 change, the rate is doubled, 2θ per bit. The phase change Δθ can be equated to frequency.

Utilizing three phase changes is a phase modulation method. When utilizing three time periods and then integrating, the same result is obtained (integrating FM result in PM). When detecting phase modulation, the triangular waveform of FIG. 8 results. when detecting frequency modulation the rectangular patterns shown in FIGS. 1 and 10 result.

The direct digital synthesizer steps in phase angle or frequency, depending on manufacturer and program settings. For example, in FIG. 15, the phase angles −θ, 0, and θ, and in FIG. 8 the upper peak, middle peak, and lower peak each having a different time.

Three code sequences are shown in FIG. 15. An alternating 10101 pattern is shown in (a). A CC HEX pattern is shown in (b), and a pattern where there are more than two bits of the same polarity in sequence is shown in (c). The same detector circuitry used for the two frequency or phase method is applicable, but the transmitted frequency is cut in half. There are no half bit width changes as shown in FIG. 8.

FIG. 16 shows an encoder circuit capable of programming a Direct Digital Synthesizer to utilize three frequencies. The D flip-flops A and B compare the incoming data in sequence. The output of B is the last bit, and the output of A is the present bit. When the two are alike, the XOR gate with inverted output is high and the frequency 2 is called for from the Direct Digital Synthesizer. If they are different, and the two AND gates, each having a different input inverted, are high either frequency 1 or frequency 3 is called for, depending on he state of B.

This three frequency or phase method utilizes the two positions of FIG. 1, with the third frequency being a midpoint, which is that of an intermediate frequency indicating there is no change from the last bit.

Figure 9:
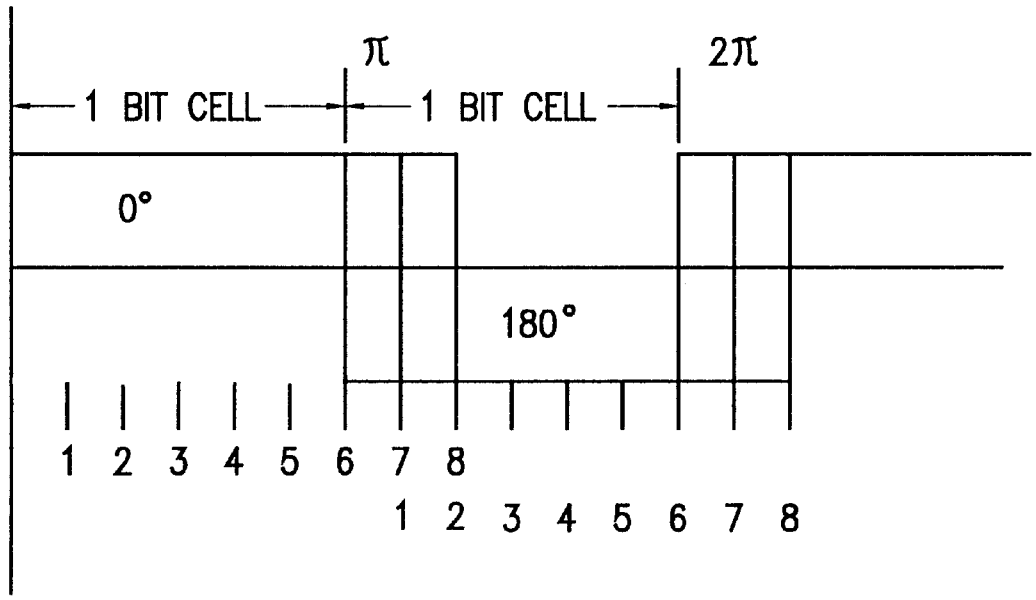
FIG. 9. Shows the previously patented VPSK encoding method referred to as Slip Coding.

FIG. 9 shows the previously patented VPSK encoding method referred to as "Slip Code." The present method has no slippage. In FIG. 9, the mid-point utilizing the present method or bit edge is indicated by the 7 count. A change to 6 or to 8, followed by a return to 7 prevents long term slippage. This is the pattern that would result from three frequencies being used with a reinserted carrier.

In FIG. 1, the modulating frequency is equal to the bit rate. In FIG. 9 it is ½ the bit rate. This can result in a theoretical improvement in the signal to noise ratio. The output peaks of the detector in FIG. 12 are used to set an R/S flip-flop according to whether the output was + or −. The output of the R/S flip-flop is the desired ones and zeroes.

The transmission frequency for the waveform shown in FIG. 1 without this return to a midpoint is equal to the phantom carrier plus the bit rate $f_b$. With the midpoint return it is $f_b/2$.

For certain application, such as FM Subcarriers and baseband transmission over power lines there is an upper frequency limit obtainable for hardware or regulatory reasons. For high data rates the frequency cutoff of the available semiconductors may be too low. The data transmission rate can be doubled utilizing the midpoint return method to overcome these limitations.

In lieu of differentiating then detecting a Manchester code, it should be obvious those skilled in the art a peak detector can be used as shown in FIG. 13. The peaks occur at the ends of data bits, hence the output is delayed one data bit respectively.

The aperture coded waveform centers around the data clock rate $f_b$ located above a phantom carrier, thus at a frequency $f_c+f_b$ leaving the direct digital synthesizer as it creates the sideband alone. This is similar to the "biphase" spectrum.

A more desirable spectrum would resemble the "bipolar" spectrum which centers around $f_b/2 = f_m$. This can be accomplished by dividing the aperture code by 2 as in FIG. 10 and as shown graphically in FIG. 15. By using a direct digital synthesizer to create the sideband only and by shifting the phase plus or minus an amount Δθ from a center position to obtain ones and zeros. A bipolar modulation pattern results which is shown in (b), (c), (d) and (e). This is equivalent to the phase shift of FIG. 1 with a rest position at the center of the bit. FIG. 16 shows a three frequency encoder for use with the modulator of FIG. 6.

Frequency modulation when integrated results in phase modulation, which when detected by normal phase detector means known to those skilled in the art results in the waveform shown in FIG. 8. The square wave input from the waveform in FIG. 1 appears as an integrated waveform in FIG. 8 as is apparent from the sloping lines. In FIG. 15(*b*) the ones and zeros spread the gap between them. The integrated waveform after frequency modulation is shown by the dotted lines.

Using a peak detector as shown in FIG. 13, the decoded data pattern would be 1100110011—or a CC Hex as in FIG. 8. The bits repeat due to the delay between ones and zeros. Alternating ones and zeros without a gap (1010101) result in the pattern shown in (d). A long string of ones is shown in (e). The R/S flip flop is set by the first one, and will remain at the one position until a negative peak is received.

One of the detection methods used for MSK and MFSK modulation by those skilled in the art involves the use of separate crystal filters for each frequency transmitted and a correlator or sample and hold detector to indicate which frequency was received. This same detection method is applicable to the present invention, although with greater intersymbol interference. Such detectors are discussed in various texts including *Wireless Communications*, by T. S. Rappaport. (Prentice Hall) and *Principals of Communications Systems* by Taub and Schilling, (McGraw Hill).

The modulation angle can be determined in terms of frequencies from the relationship:

$$\theta = \Delta f / f_b \qquad (1)$$

$$\theta = \Delta f / f_m \qquad (2)$$

To maintain a constant phase shift for comparison of the aperture code with the divide by 2 code $$\Delta f_b \qquad (1)$$

and $$\Delta f / f_m \qquad (2)$$

must be equal

Since $f_b/2 = f_m$, Δf for the return zero phase (bipolar) method obtained by dividing the first method by 2 is twice as bandwidth efficient as the aperture coded method in FIG. 1. The data rate can be doubled in the same bandwidth, or the filter can be made narrower to improve the signal to noise ratio by 2/1.

This method is particularly applicable to data modulation where the highest allowable or obtainable data rate can be doubled over that obtainable from the aperture coded method. For example the direct digital synthesizer may have an upper frequency limit of 20 MHZ when creating the single sideband signal. The data rate can be doubled at that frequency by using the bipolar method of FIG. 14.

This direct generation of the sideband without ever having used a carrier can also be used with the three time period, hence three frequency, previously patented VPSK coding method, now referred to as "Slip Coding" referred to above with a different encode/decode algorithm.

In the "Slip Coding" method (FIG. 9) there are three possible zero crossings for a bit that has been stretched according to the data pattern. The rules are: If the present bit is a repeat of the last bit, the next zero crossing will occur at 6/6 bit width from the last. (For a 6,7,8 Code. Other codes are possible, for example 8,9,10 or 10,11,12 ). If there is a change from the last bit from a one to a zero or a zero to a one, then the next zero crossing is delayed 1/6 to 7/6 bit width. If the change count is 2 less than the increment and there is a 101 in the data pipeline, the stretch is to 8/6 bit width. The decoder recognizes this extra stretch resets the counters, outputs a missed zero plus the next bit which is always a one and resets the phase ambiguity. This coding method is described in the issued patents referred to above.

It is obvious that these three time periods can also be converted to frequencies which can be generated by a digital synthesizer or numerically controlled oscillator in the same manner as the aperture codes described. The resulting signal is a single sideband signal which has been generated without a carrier ever having been used. It can be detected by means of a phantom carrier utilizing the method described by Stryzak and Walker, or by utilizing the technique commonly used for MFSK modulation which would employ three narrow band crystal filters and correlation circuitry.

One advantage of the direct sideband modulation method of the present invention is that it requires minimal filtering to meet FCC Regulations. The principal advantage is that no carrier is needed. This can be of great advantage when used with satellites where there is a frequency offset between up and down links, or when Doppler effects are encountered. The only requirement of this method is that the detected signal fit within the linear filter bandpass.

A decoder which can be used at baseband or RF for aperture coding is shown in FIG. 11. An oscillator (B) provides a clock frequency which can be several parts per million off from the actual data rate. The incoming baseband signal supplied to point E is amplified and squared to cause the spiking generator (H) to reset both the divider (D) and the counter (J). The signal is inverted in the inverter (G) and causes spikes on the reverse swing of the incoming data. The gates (K) and (L) are activated by the 6 or 7 output of the counter(J) which then pass the received spike to the RS flip flop (M) to set it's output high or low prior to the mid point of the data clock. If the output of the RS flip flop is high (having been set by a 6 count and pulse), the D input to the D flip flop (N) will be high and a one will be clocked out. If the signal at the D input is low, a zero will be clocked out. A data clock for the receiving unit is available through the inverter (0) at point (P). The same circuit can be used at RF by inputting the signal at (A), going through the mixer (c) to get the baseband signal. In this case the carrier restoration circuits previously discussed must be used to make the oscillator coherent to the incoming signal.

A decoder for Manchester coding is given in FIG. 12. This circuit uses a clock at double the bit rate which is divided by 2 in the divider (H) to get the actual clock rate. Manchester coded data from the quadrature detector is input to the D input of the D flip flop (E). A one or zero is output according to whether the first half of the bit is high or low. A shift register is used to obtain a synchronizing pulse for the divide by 2 counter (H). When two half bits alike are in the register, the XOR gate has a low output. If different, the output is high. The divide by 2 counter (H) is reset each time the half bits are different to get the clock edge and data lined up, otherwise they could be off by one half cycle at the clock output (D).

Peak detection without differentiation, as shown in FIG. 13, can also be used.

The coding and modulating method described in this invention can be analyzed using the formulas developed by R. Best ("Phase Locked Loops", McGraw Hill, 1984, pp 57–59 ).

$$SNR=\beta^2(Pin/Pout)(Nyquist\ BW/Noise\ BW)E_b/n = \beta^2 QRE_b/n$$

Where Pin/Pout is the ratio of the noise bandwidth transmitted full spectrum divided by the narrow bandwidth as actually transmitted and received. It is also equal to the (Sample Rate)/(Filter BW). This is the bandwidth efficiency in bits/second per Hz.=Q.

The Nyquist BW/Noise BW is a phase noise improvement factor which is independent of the BW efficiency and which is given the designation R. The present invention (VMSK) and the previously patented (VPSK) are heavily dependent upon this factor, the biphase encoding methods having been devised to take advantage of it. This factor does not apply to the other commonly used modulation methods such as Multiple Phase Shift Keying (MPSK) and Quadrature Amplitude Modulation (QAM), which are NRZ Line Code methods, not "Biphase" methods.

The values for the formula using aperture coding are:

$$Q = f_b/(2\Delta f) \quad SNR = \beta^2 QRE_b/n = 2.44\ E_b/n$$
$$R = f_b/(2\Delta f) \quad \beta^2 = [\pi(\Delta f/f_m)]^2 = [\pi(\Delta f/f_b)]^2$$

where $f_b = f_m$

The bandwidth efficiency is obtained without using multiple bits per symbol so N=1 bit per symbol. The data rate and sample rate are the same. When divided by 2 the signal-to-noise ratio is:

$$SNR=0.5(\pi/Q)^2 Q^2 E_b/n = 4.9\ Eb/n$$

Which is an improvement in signal-to-noise ratio of 2/1.

The Signal to noise ratio SNR is independent of the bandwidth efficiency as indicated above. This is not true of non biphase encoded modulation methods. It is also to be noted that this ratio is higher than that usually obtained from any other modulation method with the exception of Orthogonal MFSK.

Shannon's Limit might be interpreted by some to appear to be very high for this modulation method, being nearly 90 dB for a Q=26 bits/sec./Hz bandwidth efficiency. This is a misinterpretation. One bit per symbol is used in the present invention, not Q bits per symbol. The data rate equals the sampling rate and the correct Shannon's Limit is 0 dB as is proven by measurement.

While the present invention has been described in connection with several embodiments, various modifications will be obvious to those skilled in the art. Such modifications are within the spirit and scope of the present invention which is limited and defined only by the appended claims.

While there has been shown specific embodiments of the present invention, those skilled in the art will further appreciate that the present invention may be embodied in other specific forms with numerous variations without departing from the spirit or central attributes thereof. All such variations and modifications are intended to be within the scope of this invention as defined by the claims.

I claim:

1. An encoding method for digital baseband signals comprising the steps of:
   dividing a data bit, having a bit center, into a plurality of time segments or apertures;
   selecting a first subset, from said plurality of apertures, ending prior to said bit center; and,
   selecting a second subset, from said remaining plurality of apertures, which ends after said bit center.

2. The method of claim 1, further comprising the step of changing the a polarity of a signal responsive to the start of said data bit, then encoding a polarity associated with said data bit based upon said first subset, or said second subset.

3. The method of claim 2, wherein a sum of said first and second subsets equals the sum of said plurality of apertures.

4. The method of claim 2, wherein said first and second subsets are converted to frequencies generated by frequency shift means or a direct digital synthesizer producing a modulation index which is less than approximately 0.1, which alters the nature of the modulated signal from that of a carrier plus two sidebands to that of a narrow biphase single sideband alone.

5. The method of claim 1, wherein the relative durations of said first and second subsets are representative of digital ones and zeros.

6. The method of claim 1, wherein said encoded data bit has a rising edge and falling edge, and:
   in a first operational mode said rising edge is used: to determine the clock frequency and leading edge of said data bit, and said falling edge is dependent upon whether said data bit is a digital one or zero; and,
   in a second operational mode said falling edge is used: to determine the clock frequency and leading edge of said data bit, and said rising edge is dependent upon whether said data bit is a digital one or zero.

7. The method of claim 6, wherein a third frequency, corresponding to a third time period, is obtained by dividing the signal in said first operational mode by 2.

8. A digital transmission comprising the steps of:
   aperture encoding a digital baseband signal, said aperture encoding comprising: dividing a data bit, having a bit center, into a plurality of time segments or apertures; selecting a first subset, from said plurality of apertures, ending prior to said bit center; and, selecting a second subset, from said remaining plurality of time segments, which ends after said bit center;
   frequency modulating a signal responsively to said aperture coded data; and,
   receiving and detecting said modulated data using suitable receiving means.

9. The method of claim 8, further comprising the step of superimposing additional information upon said modulated data using low level amplitude modulation.

10. The method of claim 6, further comprising transmitting said aperture coded data at baseband over wires.

11. The method of claim 10, wherein said transmitting of the aperture coded data in said second transmission mode comprises transmitting a single sideband with suppressed carrier, said sideband being located at a frequency equal to the suppressed carrier offset positively or negatively by the data rate.

12. The method of claim 11, wherein said suppressed carrier is a multiple of the data rate, by the data rate or by ½ the data rate.

13. The method of claim 8, further comprising passing said single sideband through a very narrow bandpass filter which
   passes only the center frequency of the sideband plus or minus a first predetermined variance;
   wherein, a very high bandwidth efficiency and excellent signal to noise ratio are obtained.

14. The method of claim 8, wherein said suitable receiving means comprises a phase detecting or discriminating circuit which is responsive to phase or frequency shifts, but does not utilize a carrier or other reference signal.

15. The method of claim 8, wherein said suitable receiving means comprises narrow bandwidth crystal filters, and sample and hold or correlator circuitry.

16. The method of claim 8, further comprising the steps of differentiating and Manchester decoding said frequency modulated signal.

17. The method of claim 8, further comprising the step of detecting peaks of said frequency modulated signal.

18. The method of claim 8, wherein said transmission method utilizes no coherent carrier frequency, and is thus tolerative of the frequency effects of Doppler offsets when used in a relay or satellite environment.

19. The method of claim 8, further comprising transmitting said aperture coded data, wherein said aperture coding method is utilized to modulate a carrier frequency.

20. An apparatus for use with digital signals comprising:
   means for aperture coding a source signal;
   means for transmitting said aperture coded source signal;
   means for detecting and receiving said aperture coded source signal; and,
   means for decoding said aperture coded source signal;
   wherein said aperture coding includes: dividing a data bit, having a bit center, into a plurality of apertures; selecting a first subset, from said plurality of apertures ending close to said bit center; and, selecting a second subset, from said remaining plurality of apertures, which starts after said first subset.

21. An encoding method for generating a digital baseband signal derived from a multiplicity of input data bits, wherein each data bit is characterized by a temporal data bit length having a temporal bit center, said encoding method comprising:
   receiving one of said multiplicity of input data bits;
   generating an encoded digital baseband signal corresponding in timing to said one input data bit which changes digital state according to said one input data bit in correspondence to a time prior to or after said temporal bit center.

22. The method of claim 21, wherein said one input data bit has a start and wherein generating an encoded digital baseband signal which changes digital state comprises changing polarity of said digital baseband signal responsive to the start of said data bit, then recovering polarity of said digital baseband signal when said digital baseband signal changes digital state.

23. The method of claim 21 wherein said digital baseband signal has a first digital state during a first time period and a second digital state during a second time period, wherein the relative temporal durations of said first and second time periods are representative of digital ones and zeros.

24. The method of claim 21, wherein said encoded digital baseband signal has a rising edge and falling edge, and said rising edge is used to determine the clock frequency and leading edge of said digital baseband signal, and said falling edge is dependent upon whether said digital baseband signal is a digital one or zero.

25. The method of claim 21, wherein said encoded digital baseband signal has a rising edge and falling edge, and said falling edge is used to determine the clock frequency and leading edge of said digital baseband signal, and said rising edge is dependent upon whether said digital baseband signal is a digital one or zero.

26. The method of claim 21, wherein the digital states of said encoded digital baseband signal are converted to frequencies to produce a modulation index which in less than approximately 0.1, which alters the nature of said encoded digital baseband signal from that of a carrier plus two sidebands to that of a narrow biphase single sideband alone.

27. The method of claim 26, wherein said encoded digital baseband signal has a temporal duration further comprising:

doubling said temporal duration;

generating a first and second frequency corresponding to said falling edge depending on whether said digital baseband signal is a digital one or zero respectively; and generating a third frequency corresponding to a repeat of the digital state of said digital baseband signal.

28. A digital data and additional information transmission method comprising:

encoding digital data using an aperture coding method comprising dividing a data bit, having a bit center, into a plurality of time segments or apertures; selecting a first subset from said plurality of apertures, ending close to said bit center; and, selecting a second subset of apertures, from said remaining plurality of time apertures, which ends after said bit center; wherein said coding method results in a narrow Fourier spectrum containing no low frequency components and is offset from 0 Hz by a quantity equal to the data rate;

transmitting the aperture coded data utilizing phase or frequency shift modulation; and, receiving and detecting the transmitted signals using suitable receiving means.

29. The method of claim 28 further comprising the step of superimposing additional information upon the encoded digital data using low level amplitude modulation.

30. The method of claim 28, wherein said encoded signals are transmitted at baseband over wires.

31. The method of claim 28, wherein said encoded signals are transmitted at radio frequencies and said aperture coding method is utilized to modulate a carrier frequency.

* * * * *